US009525026B2

(12) United States Patent
Tsai et al.

(10) Patent No.: US 9,525,026 B2
(45) Date of Patent: Dec. 20, 2016

(54) METHOD OF FORMING AN EPITAXIAL SEMICONDUCTOR LAYER IN A RECESS AND A SEMICONDUCTOR DEVICE HAVING THE SAME

(71) Applicant: Taiwan Semiconductor Manufacturing Company, Ltd., Hsin-Chu (TW)

(72) Inventors: Chun Hsiung Tsai, Xinpu Township (TW); Tsz-Mei Kwok, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,167

(22) Filed: Nov. 16, 2015

(65) Prior Publication Data

US 2016/0079362 A1    Mar. 17, 2016

Related U.S. Application Data

(63) Continuation of application No. 14/456,651, filed on Aug. 11, 2014, now Pat. No. 9,209,020.

(Continued)

(51) Int. Cl.
*H01L 21/311* (2006.01)
*H01L 23/52* (2006.01)
(Continued)

(52) U.S. Cl.
CPC .......... *H01L 29/0684* (2013.01); *C30B 25/04* (2013.01); *C30B 29/06* (2013.01); *C30B 29/52* (2013.01);
(Continued)

(58) Field of Classification Search
CPC ............ H01L 23/5283; H01L 21/0251; H01L 21/02636; H01L 29/0684; H01L 29/32; H01L 29/36
(Continued)

(56) References Cited

U.S. PATENT DOCUMENTS 6,096,622 A * 8/2000 Kim .................. H01L 21/76224
257/E21.546
7,154,159 B2 * 12/2006 Cheng ............... H01L 21/76224
257/520

(Continued)

OTHER PUBLICATIONS

Cline, H.E. et al., "Thermomigration of aluminumrich liquid droplets in silicon," AIP Journal of Applied Physics, 43, 4391, Apr. 1972, http://dx.doi.org/10.106311.1660932, 6 pages.

(Continued)

*Primary Examiner* — Luan C Thai
(74) *Attorney, Agent, or Firm* — Slater Matsil, LLP (57) ABSTRACT

A method of manufacturing a semiconductor device may include: etching a recess in a semiconductor substrate, where the etching produces a metal residue over a surface of the recess. The recess may thereafter be exposed to a cleaning process that causes the metal residue to etch at least one fissure in the semiconductor substrate. The at least one fissure may extend from the surface of the recess into the semiconductor substrate. The method may further include epitaxially forming a liner comprising a first semiconductor material having a first dopant concentration within the recess and over the at least one fissure. The method proceeds with epitaxially forming a semiconductor layer comprising a second semiconductor material having a second dopant concentration over the liner.

20 Claims, 9 Drawing Sheets

Related U.S. Application Data (60) Provisional application No. 61/986,284, filed on Apr. 30, 2014.

(51) Int. Cl.

| | | |
|---|---|---|
| *H01L 29/06* | (2006.01) | |
| *H01L 21/02* | (2006.01) | |
| *H01L 29/32* | (2006.01) | |
| *H01L 29/36* | (2006.01) | |
| *C30B 25/04* | (2006.01) | |
| *C30B 29/06* | (2006.01) | |
| *C30B 29/52* | (2006.01) | |

(52) U.S. Cl.
CPC ....... *H01L 21/0243* (2013.01); *H01L 21/0251* (2013.01); *H01L 21/0262* (2013.01); *H01L 21/02532* (2013.01); *H01L 21/02576* (2013.01); *H01L 21/02579* (2013.01); *H01L 21/02636* (2013.01); *H01L 21/02658* (2013.01); *H01L 29/32* (2013.01); *H01L 29/36* (2013.01)

(58) Field of Classification Search
USPC .......................................... 438/696; 257/774
See application file for complete search history.

(56) References Cited

U.S. PATENT DOCUMENTS

| | | |
|---|---|---|
| 7,777,295 B2 | 8/2010 | Gogoi et al. |
| 7,919,388 B2 | 4/2011 | Radic et al. |
| 8,728,876 B2 | 5/2014 | Kurose |
| 2014/0151759 A1* | 6/2014 | Loubet .................... H01L 29/06 257/288 |

OTHER PUBLICATIONS

Huang, Zhipeng et al., "Metal-Assisted Chemical Etching of Silicon: A Review," Materials Views, www.materialsviews.com, Advanced Materials, www.advmat.de, Adv. Mater. Jan. 2011, 23, 285-308. Wileyonlinelibrary.com.

* cited by examiner

METHOD OF FORMING AN EPITAXIAL SEMICONDUCTOR LAYER IN A RECESS AND A SEMICONDUCTOR DEVICE HAVING THE SAME

PRIORITY CLAIM AND CROSS-REFERENCE

The present application claims priority to and is a continuation of U.S. patent application Ser. No. 14/456,651, filed on Aug. 11, 2014, and entitled "Method of Forming an Epitaxial Semiconductor Layer in a Recess and a Semiconductor Device Having the Same," which application claims the benefit of U.S. Provisional Application No. 61/986,284, filed on Apr. 30, 2014, entitled "Method of Forming an Epitaxial Semiconductor Layer in a Recess and a Semiconductor Device Having the Same," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by processing a semiconductor substrate, e.g. by sequentially depositing insulating or dielectric layers, conductive layers, and semiconductive layers of material over a semiconductor substrate, and patterning the various material layers using lithography or etching (e.g., wet and/or dry etching) to form circuit components and elements thereon.

Processing the semiconductor substrate may include forming a recess in the semiconductor substrate by means of an etching process. The etching process may result in a metal residue being formed on a surface (e.g. sidewall and/or bottom surface) of the recess. The recess having the metal residue may subsequently be cleaned by means of a wet clean process, as an example. The presence of the metal residue during the cleaning process (e.g. wet clean process) may result in unintended metal-assisted chemical etching (MACE) of the semiconductor substrate, thus forming at least one fissure in the semiconductor substrate. The at least one fissure may adversely affect manufacturing yield and semiconductor device reliability. There is a need to solve this problem, and new ways of manufacturing a semiconductor device may be needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
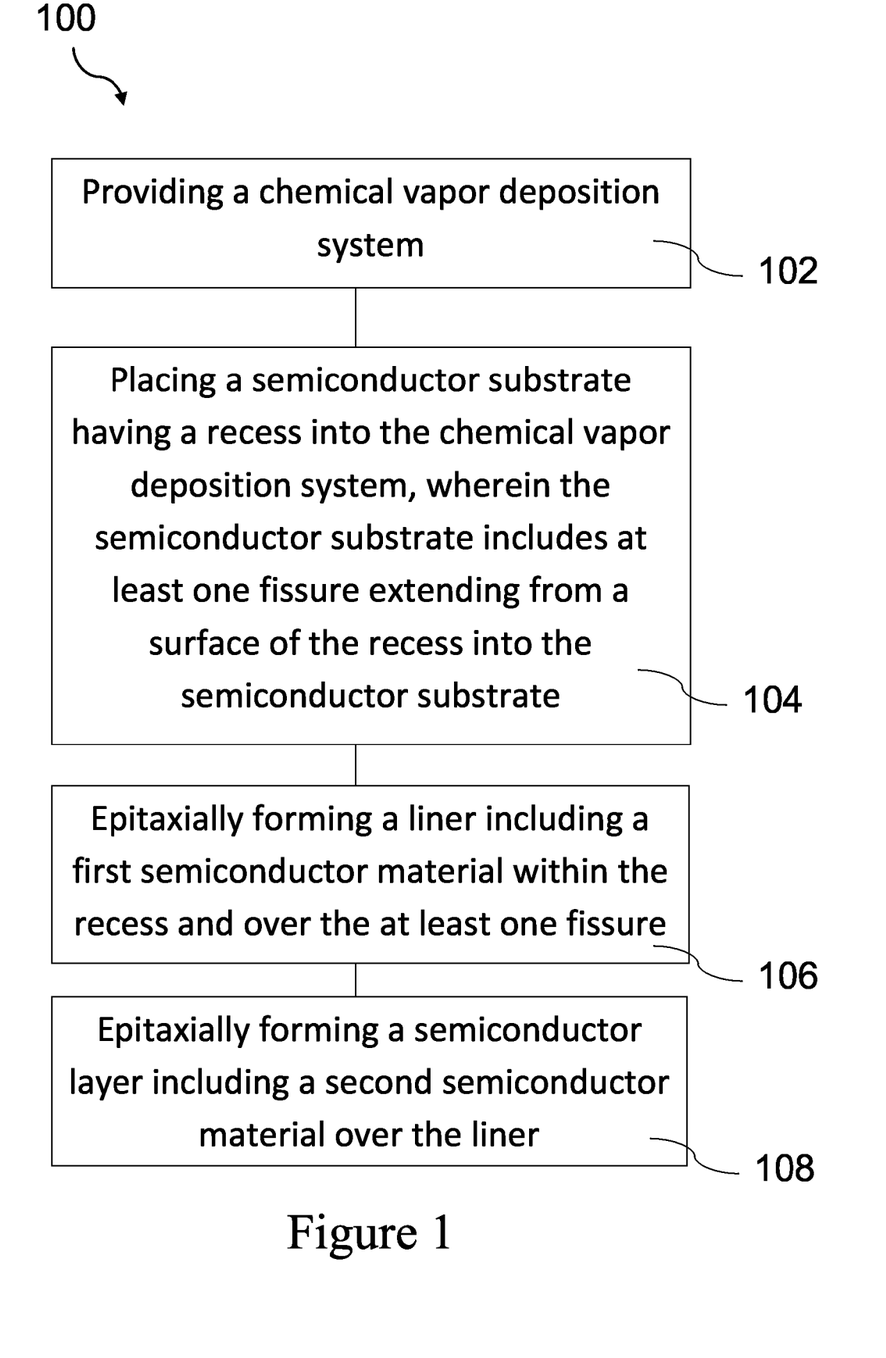
FIG. 1 shows a method of forming an epitaxial semiconductor layer in a recess, in accordance with some embodiments.

FIG. 1 shows a method 100 of epitaxially forming a semiconductor layer in a recess, in accordance with one or more embodiments.

The method 100 may include providing a chemical vapor deposition system (in 102); placing a semiconductor substrate having a recess into the chemical vapor deposition system, wherein the semiconductor substrate includes at least one fissure extending from a surface of the recess into the semiconductor substrate (in 104); epitaxially forming a liner including a first semiconductor material within the recess and over the at least one fissure (in 106); and epitaxially forming a semiconductor layer including a second semiconductor material over the liner (in 108).

FIG. 2A to FIG. 2E show a process flow illustrating the method 100 of epitaxially forming a semiconductor layer in a recess, in accordance with one or more embodiments.

Figure 2A:
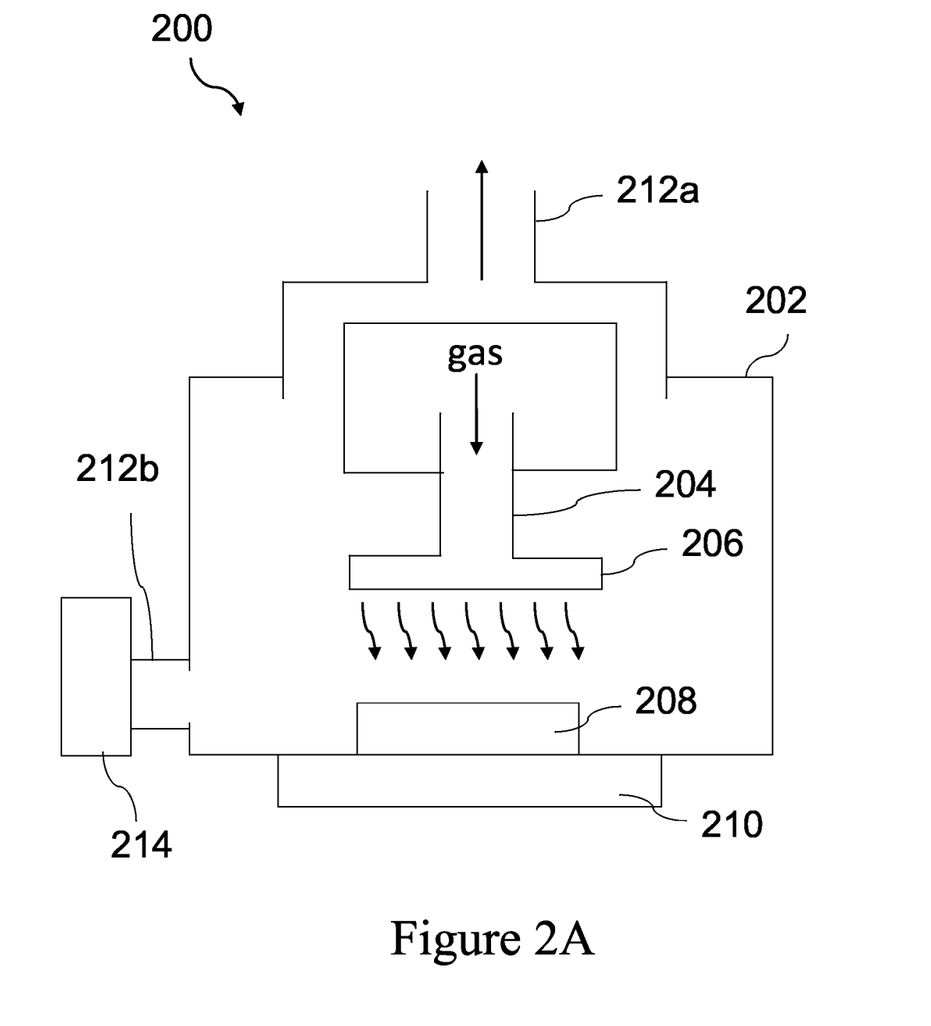
FIG. 2A to FIG. 2E show a process flow illustrating a method of epitaxially forming a semiconductor layer in a recess, in accordance with some embodiments.

As shown in FIG. 2A in a cross-sectional view, the method 100 of epitaxially forming a semiconductor layer in a recess may include providing a chemical vapor deposition (CVD) system 200.

In an embodiment, the CVD system 200 includes a reaction chamber 202, an inlet tube 204, a nozzle 206, a holder 208, a heater 210, exhaust ports 212a, 212b, and an evacuation pump 214.

A gas may be introduced into the reaction chamber 202 via the inlet tube 204. The gas may be channeled to an area over the holder 208 via the nozzle 206. A semiconductor substrate (not shown in FIG. 2A, see description below in respect of FIG. 2B) may be placed on the holder 208, and the heater 210 disposed under the holder 208 at an exterior wall of the reaction chamber 202 may heat the semiconductor substrate.

The reaction chamber 202 may be evacuated via exhaust ports 212a, 212b, e.g. by the evacuation pump 214. The gas introduced into the reaction chamber 202 may pass through a mesh structure (not shown in FIG. 2A) in the nozzle 206 such that the gas uniformly covers a surface of a semiconductor substrate that may be placed on the holder 208. The uniform distribution of the gas over the holder 208 is shown in FIG. 2A as arrows over the holder 208.

The gas introduced into the reaction chamber 202 may include, or may be, a mixture of at least one source gas, a carrier gas, and an etchant gas.

The at least one source gas may include a material for deposition on a semiconductor substrate that may be placed in the CVD system 200. For example, in an embodiment where pure silicon is the material for deposition, the at least one source gas may include, or may be, a gaseous compound containing silicon. By way of another example, in an embodiment where doped silicon is the material for deposition, the at least source gas may include, or may be, a gaseous compound containing silicon and a gaseous compound containing a dopant for doping the silicon.

The carrier gas may be an inert gas (e.g. $H_2$ or $N_2$) used as a vehicle for the at least one source gas.

The etchant gas may be a gas that may, for example, be used to etch and/or clean a surface of a semiconductor substrate placed in the CVD system 200.

Figure 2B:
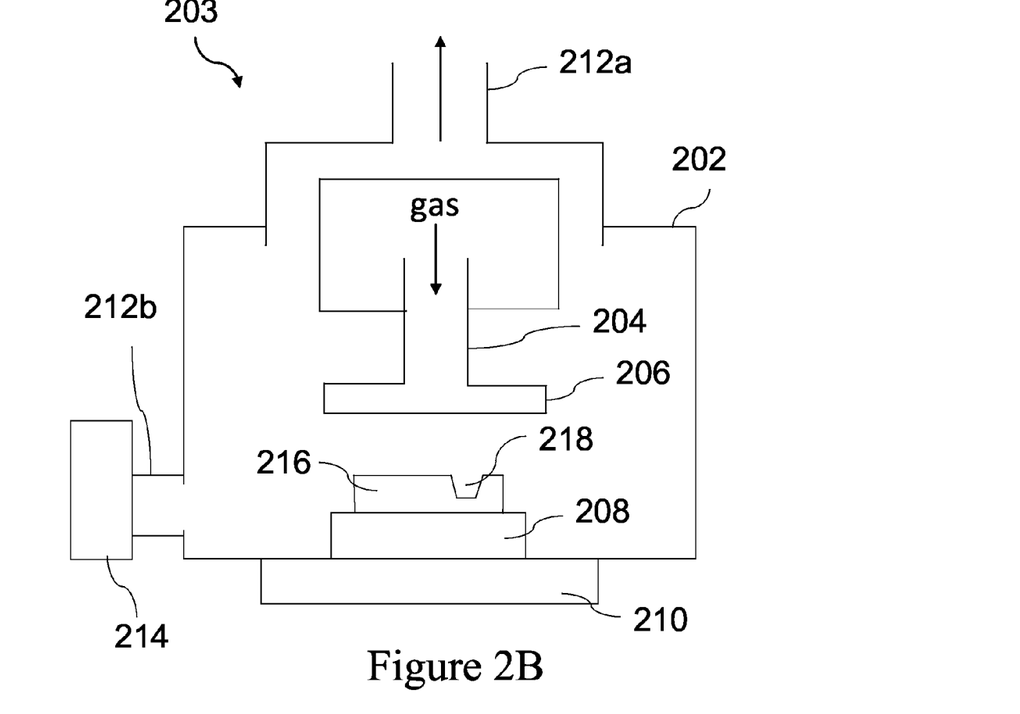

As shown in FIG. 2B in a view 203, the method 100 of epitaxially forming a semiconductor layer in a recess may include placing a semiconductor substrate 216 having a recess 218 into the CVD system 200 shown in FIG. 2A. The semiconductor substrate 216 may be disposed on the holder 208 of the CVD system 200 and may be heated by means of the heater 210 of the CVD system 200.

Figure 2C:
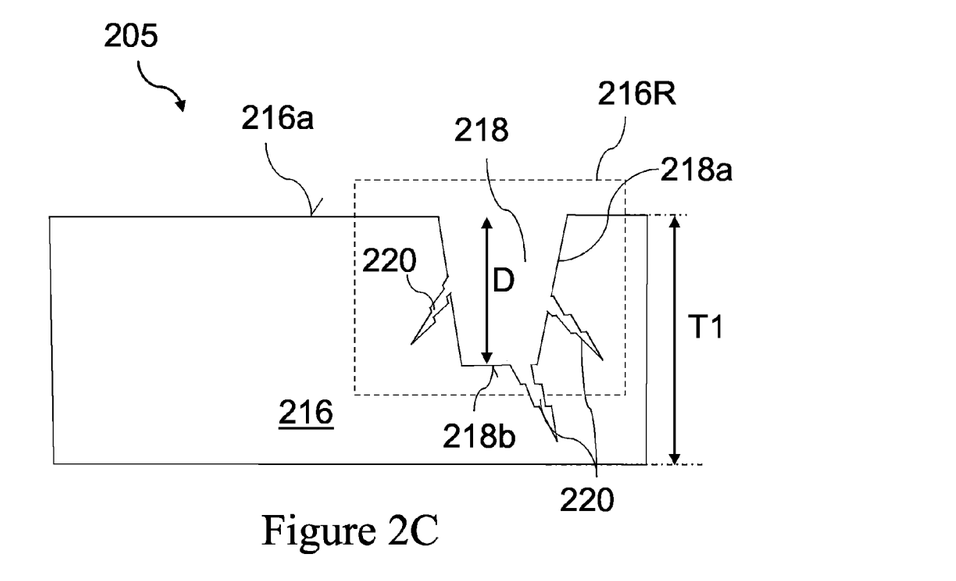

FIG. 2C shows a zoomed-in view 205 of the semiconductor substrate 216 having the recess 218.

Only one recess 218 is shown as an example, however the number of recesses 218 may be greater than one, and may, for example, be on the order of tens of, or even more, recesses in some embodiments.

The semiconductor substrate 216 may have a top surface 216a. In one or more embodiments, the top surface 216a may refer to a surface of the semiconductor substrate 216 that may be processed (e.g. by etching, by depositing material, etc.).

The semiconductor substrate 216 may include, or may consist of, a semiconductor material. In accordance with an embodiment, the semiconductor material may include, or may consist of, at least one material selected from a group of materials, the group consisting of: silicon, germanium, gallium nitride, gallium arsenide, and silicon carbide, although other materials may be possible as well in accordance with other embodiments.

In one or more embodiments, the semiconductor substrate 216 may be a doped semiconductor substrate. In an embodiment, the doped semiconductor substrate may include, or may be, a doped silicon substrate, a doped germanium substrate, a doped gallium nitride substrate, a doped gallium arsenide substrate, or a doped silicon carbide substrate, although other doped semiconductor substrates may be possible as well in accordance with other embodiments. In this connection, the term "doped substrate" may include an embodiment where the entire semiconductor substrate 216 is doped, as well as another embodiment where only a part (for example, an upper part) of the semiconductor substrate 216 is doped.

The semiconductor substrate 216 may be a p-doped substrate (in other words, a semiconductor substrate 216 doped with a p-type dopant) or an n-doped substrate (in other words, a semiconductor substrate 216 doped with an n-type dopant). In accordance with an embodiment, the dopants for doping the semiconductor substrate 216 may include, or may consist of, at least one material selected from a group of materials, the group consisting of: boron, aluminum, gallium, indium, antimony, phosphorus, arsenic, and antimony, although other materials may be possible as well in accordance with other embodiments. By way of an example, the semiconductor substrate 216 may be a silicon substrate doped with a p-type dopant such as boron. By way of another example, the semiconductor substrate 216 may be a silicon substrate doped with an n-type dopant such as phosphorous, arsenic or antimony.

In one or more embodiments, the semiconductor substrate 216 may include, or may be, a bulk semiconductor substrate.

In one or more embodiments, the semiconductor substrate 216 may include, or may consist of, a substrate with at least one semiconductor layer such as, for example, a silicon-on-insulator (SOI) semiconductor substrate. In accordance with an embodiment, the at least one semiconductor layer may include, or may consist of, at least one material selected from a group of materials, the group consisting of: silicon, germanium, gallium nitride, gallium arsenide, and silicon carbide, although other materials may be possible as well in accordance with other embodiments.

In one or more embodiments, the semiconductor substrate 216 may include, or may consist of, a semiconductor substrate with at least one dielectric layer such as, for example, a silicon-on-insulator (SOI) semiconductor substrate. In accordance with an embodiment, the at least one dielectric layer may include at least one material selected from a group of materials, the group consisting of: an oxide, a nitride and an oxynitride, although other materials may be possible as well in accordance with other embodiments.

As shown in FIG. 2C, the recess 218 may be disposed at the top surface 216a of the semiconductor substrate 216. For example, a mouth of the recess 218 may be disposed at the top surface 216a of the semiconductor substrate 216.

The recess 218 may be disposed in a region 216R of the semiconductor substrate 216. In an embodiment, the region 216R may include, or may be, an active region or an active area of the semiconductor substrate 216. In this connection, the term "active region" or "active area" may include, or may be, a region or an area of the semiconductor substrate 216 that is defined for further processing (e.g. by etching, by depositing material, etc.). In an embodiment, the region 216R of the semiconductor substrate 216 in which the recess 218 is disposed may include, or may be, a source region or a drain region of a semiconductor device manufactured according to the method 100 shown in FIG. 1 and/or the process flow shown in FIG. 2A to FIG. 2E.

The recess 218 may include at least one sidewall 218a and a bottom surface 218b. In accordance with an embodiment, the at least one sidewall 218a of the recess 218 may be slanted. However, in another embodiment, the at least one sidewall 218a of the recess 218 may be at least substantially perpendicular to the top surface 216a of the semiconductor substrate 216. In such an embodiment, the at least one sidewall 218a of the recess 218 may be at least substantially vertical.

In one or more embodiments, the recess 218 may extend partially through the semiconductor substrate 216. In other words, a depth D of the recess 218 may be less than a thickness T1 of the semiconductor substrate 216. The depth D of the recess 218 may be measured from the mouth of the recess 218 to the bottom surface 218b of the recess 218, as shown in the example of FIG. 2C. In an embodiment, the depth D of the recess 218 may be in the range from about 15 nm to about 40 nm, for example in the range from about 20 nm to about 35 nm, for example about 30 nm, although other values may be possible as well in accordance with other embodiments.

In an embodiment, the recess 218 may be formed by means of an etching process. The etching process may include, or may be, at least one of a wet etch process and a dry etch process (e.g. a plasma etch process), or other suitable etching processes. The etching process for forming the recess 218 may be performed external to the CVD system 200 and the semiconductor substrate 216 having the recess 218 may be introduced into the CVD system 200 after formation of the recess 218.

In accordance with an embodiment, the etching process for forming the recess 218 may be performed in conjunction with a patterned etch mask, which may be formed over a part of the top surface 216a of the semiconductor substrate 216. The patterned etch mask may be formed by depositing a masking material over the semiconductor substrate 216, and patterning the masking material to form the patterned etch mask. Patterning the masking material may include, or may consist of, a lithographic process (e.g. a photo-lithographic process). The patterned etch mask may be removed after forming the recess 218.

The etching process for forming the recess 218 may introduce metal residue on the top surface 216a of the semiconductor substrate 216 and a surface of the recess 218, e.g. the at least one sidewall 218a and/or bottom surface 218b of the recess 218. In an embodiment, the metal residue may include at least one metal selected from a group of metals, the group consisting of: iron, chromium, gold, platinum, silver, and aluminum, although other metals may be possible as well in accordance with other embodiments.

Subsequent to forming the recess 218, the semiconductor substrate 216 may be cleaned, e.g. by means of a wet clean process. The cleaning process may include use of an etchant such as, for example, at least one of dilute hydrofluoric acid (DHF), potassium hydroxide (KOH), and tetra-methyl ammonium hydroxide (TMAH or $(CH_3)_3NOH$), although other etchants may be possible as well.

The cleaning process (e.g. wet clean process) may further include use of an oxidizing agent, e.g. hydrogen peroxide ($H_2O_2$), water ($H_2O$), oxygen ($O_2$), or a compound that includes oxygen. The cleaning process may be performed external to the CVD system 200 and the cleaned semiconductor substrate 216 having the recess 218 may be introduced into the CVD system 200 after the cleaning process.

In the presence of the etchant (e.g. DHF) and the oxidizing agent (e.g. $H_2O_2$) of the cleaning process (e.g. wet clean process), the metal residue accumulated on the top surface 216a of the semiconductor substrate 216 and the surface of the recess 218 (e.g. the at least one sidewall 218a and/or bottom surface 218b of the recess 218) can act as a catalyst for further etching of the semiconductor substrate 216. This further etching of the semiconductor substrate 216 during cleaning of the recess 218 is an unintended etching process. In other words, the metal residue may result in (unintended) metal-assisted chemical etching (MACE) of the semiconductor substrate 216, thus forming at least one fissure 220 in the semiconductor substrate 216. In an embodiment where the semiconductor substrate 216 includes, or consists of, silicon, the metal residue may result in (unintended) metal-assisted silicon etching (MASE).

Only three fissures 220 are shown as an example, however the number of fissures 220 may be greater than three, and may, for example, be on the order of tens, hundreds of, or even more, fissures in some embodiments. Furthermore, the three fissures are not drawn to scale and are meant to be illustrative.

The at least one fissure 220 may extend from the surface of the recess 218 (e.g. the at least one sidewall 218a and/or bottom surface 218b of the recess 218) into the semiconductor substrate 216. For example, the at least one fissure 220 may be disposed in the region 216R (e.g. active region or area) of the semiconductor substrate 216. By way of another example, the at least one fissure 220 may extend into a bulk region of the semiconductor substrate 216.

Figure 2D:
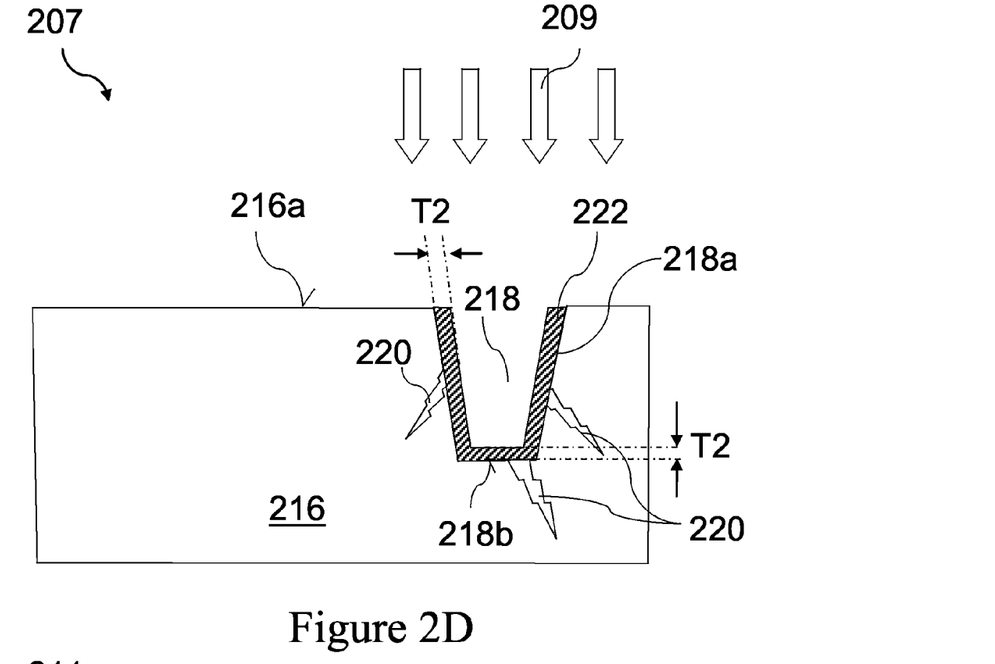

As shown in FIG. 2D in a view 207, the method 100 of epitaxially forming a semiconductor layer in a recess may include epitaxially forming a liner 222 within the recess 218 and over the at least one fissure 220. The epitaxial process for forming the liner 222 is shown in FIG. 2D as arrows 209.

In the embodiment shown in FIG. 2D, the liner 222 may coat the surface of the recess 218, e.g. coat the at least one sidewall 218a and the bottom surface 218b of the recess 218. In other words, the liner 222 may conform to a shape and/or contour of the at least one sidewall 218a and/or bottom surface 218b of the recess 218.

The liner 222 formed over the at least one fissure 220 may completely cover the at least one fissure 220, as shown in the example of FIG. 2D. In an embodiment, an effect of forming the liner 222 over the at least one fissure 220 may be provision of a barrier over the at least one fissure 220. The liner 222, functioning as a barrier, may prevent or reduce accumulation of material in the at least one fissure 220 and/or etching of the semiconductor substrate 216 through the at least one fissure 220 during further processing of the semiconductor substrate 216. Consequently, damage in the region 216R (e.g. active region or active area) of the semiconductor substrate 216 may be reduced or avoided. Accordingly, manufacturing yield and semiconductor device reliability may be improved.

A thickness T2 of the liner 222 may be measured from a surface of the liner 222 proximal a surface of the recess 218 to a surface of the liner 222 distal the surface of the recess 218.

For example, for the portion of the liner 222 disposed over the at least one sidewall 218a of the recess 218, the thickness T2 of the liner 222 may be measured from a surface of the liner 222 proximal the least one sidewall 218a of the recess 218 to a surface of the liner 222 distal the at least one sidewall 218a of the recess 218, as shown in FIG. 2D.

Similarly, for the portion of the liner 222 disposed over the bottom surface 218b of the recess 218, the thickness T2 of the liner 222 may be measured from a surface of the liner 222 proximal the bottom surface 218b of the recess 218 to a surface of the liner 222 distal the bottom surface 218b of the recess 218, as shown in FIG. 2D.

The thickness T2 of the liner 222 may be in a range from about 1 nanometer to about 5 nanometers, for example in a range from about 1 nanometer to about 3 nanometers or in a range from about 2 nanometers to about 5 nanometers.

The liner 222 may include, or may consist of, a first semiconductor material.

In an embodiment, the first semiconductor material of the liner 222 may include, or may be, a doped semiconductor material that may be formed (e.g., grown and/or deposited) by means of the epitaxial process 209.

In an embodiment, the doped semiconductor material of the liner 222 may include, or may be, doped silicon, although other doped semiconductor materials (e.g., doped silicon germanium) may be possible as well in accordance with other embodiments.

The doped semiconductor material of the liner 222 may have a conductivity type that may be different from the conductivity type of the semiconductor substrate 216.

For example, in an embodiment, the doped semiconductor material of the liner 222 may include n-type dopants, and the semiconductor substrate 216 may include, or may be, a semiconductor substrate doped with a p-type dopant. For example, the doped semiconductor material of the liner 222 may include, or may be, phosphorus-doped silicon (e.g., Si:P) or arsenic-doped silicon (e.g., Si:As), and the semiconductor substrate 216 may include, or may be, boron-doped silicon (e.g., Si:B) or boron-doped silicon germanium (e.g., SiGe:B).

By way of another example, in an embodiment, the doped semiconductor material of the liner 222 may include p-type dopants, and the semiconductor substrate 216 may include, or may be, a semiconductor substrate doped with an n-type dopant. For example, the doped semiconductor material may include, or may be, boron-doped silicon (e.g., Si:B) or boron-doped silicon germanium (e.g., SiGe:B), and the semiconductor substrate 216 may include, or may be, phosphorus-doped silicon (e.g., Si:P).

The doped semiconductor material of the liner 222 may have a constant doping profile or a graded doping profile.

In an embodiment where the doped semiconductor material of the liner 222 has a graded doping profile, a dopant concentration may be higher proximal a surface of the recess 218, while the dopant concentration may be lower distal the surface of the recess 218.

For example, in the portion of the liner 222 disposed over the at least one sidewall 218a of the recess 218, the dopant concentration of the doped semiconductor material of the liner 222 may be higher proximal the at least one sidewall 218a of the recess 218 and may be lower distal the at least one sidewall 218a of the recess 218.

Similarly, in the portion of the liner 222 disposed over the bottom surface 218b of the recess 218, the dopant concentration of the doped semiconductor material of the liner 222 may be higher proximal the bottom surface 218b of the recess 218 and may be lower distal the bottom surface 218b of the recess 218.

A concentration of dopant atoms in the doped semiconductor material of the liner 222 may be less than or equal to about $4 \times 10^{20}$ atoms per cubic centimeter, for example less than about $5 \times 10^{19}$ atoms per cubic centimeter, or in the range from about $1 \times 10^{18}$ atoms per cubic centimeter to about $4 \times 10^{20}$ atoms per cubic centimeter. For example, in an embodiment, a concentration of phosphorus atoms in a phosphorus-doped semiconductor material (e.g., SiP) of the liner 222 may be less than about $5 \times 10^{19}$ atoms per cubic centimeter.

In an embodiment, an effect of having the above-identified dopant concentrations may be that dopant atoms of the doped semiconductor material of the liner 222 are held or locked in place within the lattice of the liner 222. Accordingly, diffusion of the dopant atoms of the doped semiconductor material of the liner 222 into the at least one fissure 220 during further processing of the semiconductor substrate 216 may be reduced or avoided. Consequently, accumulation of material in the at least one fissure 220 is reduced or avoided, and damage in the region 216R (e.g. active region or active area) of the semiconductor substrate 216 may be reduced or avoided. Accordingly, manufacturing yield and semiconductor device reliability may be improved.

In an embodiment, the first semiconductor material of the liner 222 may include, or may be, an undoped semiconductor material that may be formed (e.g., grown and/or deposited) by means of the epitaxial process 209.

In an embodiment, the undoped semiconductor material of the liner 222 may include, or may be, undoped silicon, although other undoped semiconductor materials (e.g., undoped silicon germanium) may be possible as well in accordance with other embodiments.

The epitaxial process 209 may be performed at a temperature in a range from about 550° C. to about 800° C., for example in a range from about 550° C. to about 700° C., or in a range from about 650° C. to about 700° C., or in a range from about 650° C. to about 800° C. For example, the liner 222 may be grown at a temperature falling in at least one of the above-identified temperature ranges of the epitaxial process 209.

The liner 222 may be grown at a temperature falling in a higher range of at least one of the above-identified temperature ranges of the epitaxial process 209. In an embodiment, an effect of growing the liner 222 at such a temperature may be promotion of solid phase epitaxial regrowth (SPER) in the at least one fissure 220. Accordingly, the deleterious effects of MACE on the semiconductor substrate 216 may be reduced or eliminated. Consequently, damage in the region 216R (e.g. active region or active area) of the semiconductor substrate 216 may be reduced or avoided. Accordingly, manufacturing yield and semiconductor device reliability may be improved.

The epitaxial process 209 may include provision of a gas into the reaction chamber 202 of the CVD system 200 via the inlet tube 204.

The gas may include, or may be, a mixture of at least one source gas, which may include the first semiconductor material.

For example, in an embodiment where the first semiconductor material includes, or consists of, an undoped semiconductor material, the at least one source gas may include the undoped semiconductor material. For example, in an embodiment where the semiconductor material of the first semiconductor material includes, or consists of, silicon, the at least one source gas may include, or may be, at least one of silane ($SiH_4$), disilane ($Si_2H_6$), and dichlorosilane ($SiH_2Cl_2$). In an embodiment, silane or disilane may be preferred over dichlorosilane, since silane or disilane may result in an increased deposition rate of silicon in the epitaxial process 209, e.g. especially at a temperature falling in a lower range of at least one of the above-identified temperature ranges of the epitaxial process 209.

By way of another example, in an embodiment where the first semiconductor material includes, or consists of, a doped semiconductor material, the at least one source gas may include a first source gas including the semiconductor material, and a second source gas including a dopant for the semiconductor material. For example, in an embodiment where the first semiconductor material includes, or consists of, doped silicon (e.g. phosphorus-doped silicon), the first source gas may include, or may be, at least one of silane ($SiH_4$), disilane ($Si_2H_6$), and dichlorosilane ($SiH_2Cl_2$), and the second source gas may include, or may be, a gas containing a dopant for silicon (e.g. phosphine). Similar to the embodiment described above, silane or disilane may be preferred over dichlorosilane at a temperature falling in a lower range of at least one of the above-identified temperature ranges of the epitaxial process 209.

The gas provided into the reaction chamber 202 during the epitaxial process 209 may include a carrier gas, which may be an inert gas (e.g. $H_2$ or $N_2$) used as a vehicle for the at least one source gas.

The gas provided into the reaction chamber 202 during the epitaxial process 209 may include an etchant gas, which may be a gas that may, for example, be used to etch and/or clean a surface of the semiconductor substrate 216. The etchant gas may include, or may be, chlorine gas, hydrochloric acid gas (HCl), or a gaseous compound containing chlorine.

In an embodiment, chlorine present in the etchant gas may help to desorb hydrogen from the top surface 216a of the semiconductor substrate 216 and/or the surfaces 218a, 218b of the recess 218.

The epitaxial process 209 may include, or may be, a non-selective epitaxial process or a selective epitaxial growth (SEG) process.

A selectivity of the epitaxial growth process 209 may be controlled, at least in part, by a partial pressure of the etchant gas. In one or more embodiments, the partial pressure of the etchant gas provided during the epitaxial process 209 may be less than about 10 Torrs, for example in a range from about 0.01 Torrs to about 10 Torrs, for example in a range from about 0.1 Torrs to about 6 Torrs, for example in a range from about 1 Torr to about 5 Torrs, although other partial pressures may be possible as well in accordance with other embodiments.

In an embodiment, an effect of the partial pressure of the etchant gas provided during the epitaxial process 209 being in at least one of the above-identified pressure ranges may be prevention or reduction of etching the semiconductor substrate 216 through the at least one fissure 220. Consequently, damage in the region 216R (e.g. active region or active area) of the semiconductor substrate 216 may be reduced or avoided. Accordingly, manufacturing yield and semiconductor device reliability may be improved.

Figure 2E:
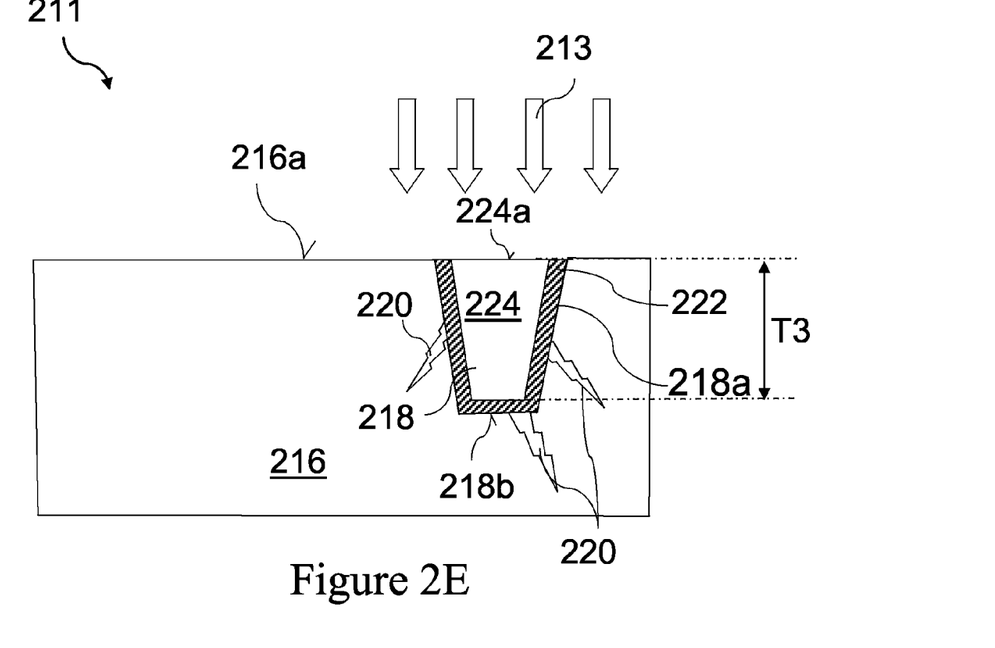

As shown in FIG. 2E in a view 211, the method 100 of epitaxially forming a semiconductor layer in a recess may include epitaxially forming a semiconductor layer 224 over the liner 222. The epitaxial process for forming the semiconductor layer 224 is shown in FIG. 2E as arrows 213.

The semiconductor layer 224 formed over the liner 222 may fill the recess 218.

For example, in an embodiment, a top surface 224a of the semiconductor layer 224 may be at least substantially flush with (i.e., co-planar with) the top surface 216a of the semiconductor substrate 216, as shown in the embodiment of FIG. 2E.

In another embodiment, the semiconductor layer 224 may fill the recess 218 and the top surface 224a of the semiconductor layer 224 may be disposed above the top surface 216a of the semiconductor substrate 216. In such an embodiment, the portion of the semiconductor layer 224 above the top surface 216a of the semiconductor substrate 216 may be removed (e.g. by means of an etching process) at a later stage.

A thickness T3 of the semiconductor layer 224 may be measured from a top-most surface of the semiconductor layer 224 to a bottom-most surface of the semiconductor layer 224.

For example, the thickness T3 of the semiconductor layer 224 may be measured from the top surface 224a of the semiconductor layer 224 to the bottom-most surface of the semiconductor layer 224, namely, the surface of the semiconductor layer 224 facing the bottom surface 218b of the recess 218.

The thickness T3 of the semiconductor layer 224 may be in a range from about 15 nanometers to about 60 nanometers, for example in a range from about 20 nanometers to about 40 nanometers or in a range from about 15 nanometers to about 45 nanometers.

The semiconductor layer 224 may include, or may consist of, a second semiconductor material.

In an embodiment, the second semiconductor material of the semiconductor layer 224 may include, or may be, a doped semiconductor material that may be formed (e.g., grown and/or deposited) by means of the epitaxial process 213.

In an embodiment, the doped semiconductor material of the semiconductor layer 224 may include, or may be, doped silicon, although other doped semiconductor materials (e.g., doped silicon germanium) may be possible as well in accordance with other embodiments.

The doped semiconductor material of semiconductor layer 224 may have a conductivity type that may be different from the conductivity type of the semiconductor substrate 216. For example, in an embodiment, the doped semiconductor material of the semiconductor layer 224 may include n-type dopants, and the semiconductor substrate 216 may include, or may be, a semiconductor substrate doped with a p-type dopant.

For example, the doped semiconductor material of the semiconductor layer 224 may include, or may be, phosphorus-doped silicon (e.g., SiP) or arsenic-doped silicon (e.g., SiAs), and the semiconductor substrate 216 may include, or may be, boron-doped silicon (e.g., SiB) or boron-doped silicon germanium (e.g., SiGeB).

By way of another example, in an embodiment, the doped semiconductor material of the semiconductor layer 224 may include p-type dopants, and the semiconductor substrate 216 may include, or may be, a semiconductor substrate doped with an n-type dopant. For example, the doped semiconductor material may include, or may be, boron-doped silicon (e.g., SiB) or boron-doped silicon germanium (e.g., SiGeB), and the semiconductor substrate 216 may include, or may be, phosphorus-doped silicon (e.g., SiP).

In an embodiment, the doped semiconductor material of the semiconductor layer 224 may include, or may consist of, at least one material selected from a group of materials, the group consisting of: carbon, silicon, and phosphorus, although other materials may be possible as well in accordance with other embodiments.

The doped semiconductor material of the semiconductor layer 224 may have a constant doping profile or a graded doping profile.

In an embodiment where the doped semiconductor material of the semiconductor layer 224 has a graded doping profile, a dopant concentration may be higher proximal the top surface 216a of the semiconductor substrate 216, while the dopant concentration may be lower distal the top surface 216a of the substrate 216.

A concentration of dopant atoms in the doped semiconductor material of the semiconductor layer 224 may be greater than the concentration of dopant atoms in a doped semiconductor material of the liner 222.

For example, the concentration of dopant atoms in the doped semiconductor material of the semiconductor layer 224 may be greater than about $4 \times 10^{20}$ atoms per cubic centimeter. For example, in an embodiment, a concentration of phosphorus atoms in a phosphorus-doped semiconductor material (e.g., SiP or SiCP) of the semiconductor layer 224 may be greater than about $4 \times 10^{20}$ atoms per cubic centimeter.

The epitaxial process 213 may be performed at a temperature in a range from about 550° C. to about 750° C., for example about 680° C. or about 560° C.

The epitaxial process 213 may include provision of a gas into the reaction chamber 202 of the CVD system via the inlet tube 204.

The gas may include at least one source gas, which may include the second semiconductor material.

For example, in an embodiment where the second semiconductor material includes, or consists of, a doped semiconductor material, the at least one source gas may include a first source gas including the semiconductor material, and a second source gas including a dopant for the semiconductor material. For example, in an embodiment where the second semiconductor material includes, or consists of, doped silicon (e.g. phosphorus-doped silicon), the first source gas may include, or may be, at least one of silane ($SiH_4$), disilane ($Si_2H_6$), and dichlorosilane ($SiH_2Cl_2$), and the second source gas may include, or may be, a gas containing a dopant for silicon (e.g. phosphine). Similar to the embodiments described above, silane or disilane may be preferred over dichlorosilane at a temperature falling in a lower range of at least one of the above-identified temperature ranges of the epitaxial process 213.

The gas provided into the reaction chamber 202 during the epitaxial process 213 may include a carrier gas, which may be an inert gas (e.g. $H_2$ or $N_2$) used as a vehicle for the at least one source gas.

The gas provided into the reaction chamber 202 during the epitaxial process 213 may include an etchant gas, which may be a gas that may, for example, be used to etch and/or clean a surface of the semiconductor substrate 216. The etchant gas may include, or may be, chlorine gas, hydrochloric acid gas (HCl), or a gaseous compound containing chlorine.

In an embodiment, chlorine present in the etchant gas may help to desorb hydrogen from the top surface 216a of the semiconductor substrate 216 and/or the surfaces of the liner 222.

The epitaxial process 213 may include, or may be, at least one of a cyclic deposition etch (CDE) process and a selective epitaxial growth (SEG) process.

In one or more embodiments, the partial pressure of the etchant gas provided during the epitaxial growth process 213 may be greater than about 0.01 Torrs, for example in a range from about 0.01 Torrs to about 10 Torrs, for example in a range from about 0.1 Torrs to about 6 Torrs, for example in a range from about 1 Torr to about 5 Torrs, although other partial pressures may be possible as well in accordance with other embodiments.

Figure 3:
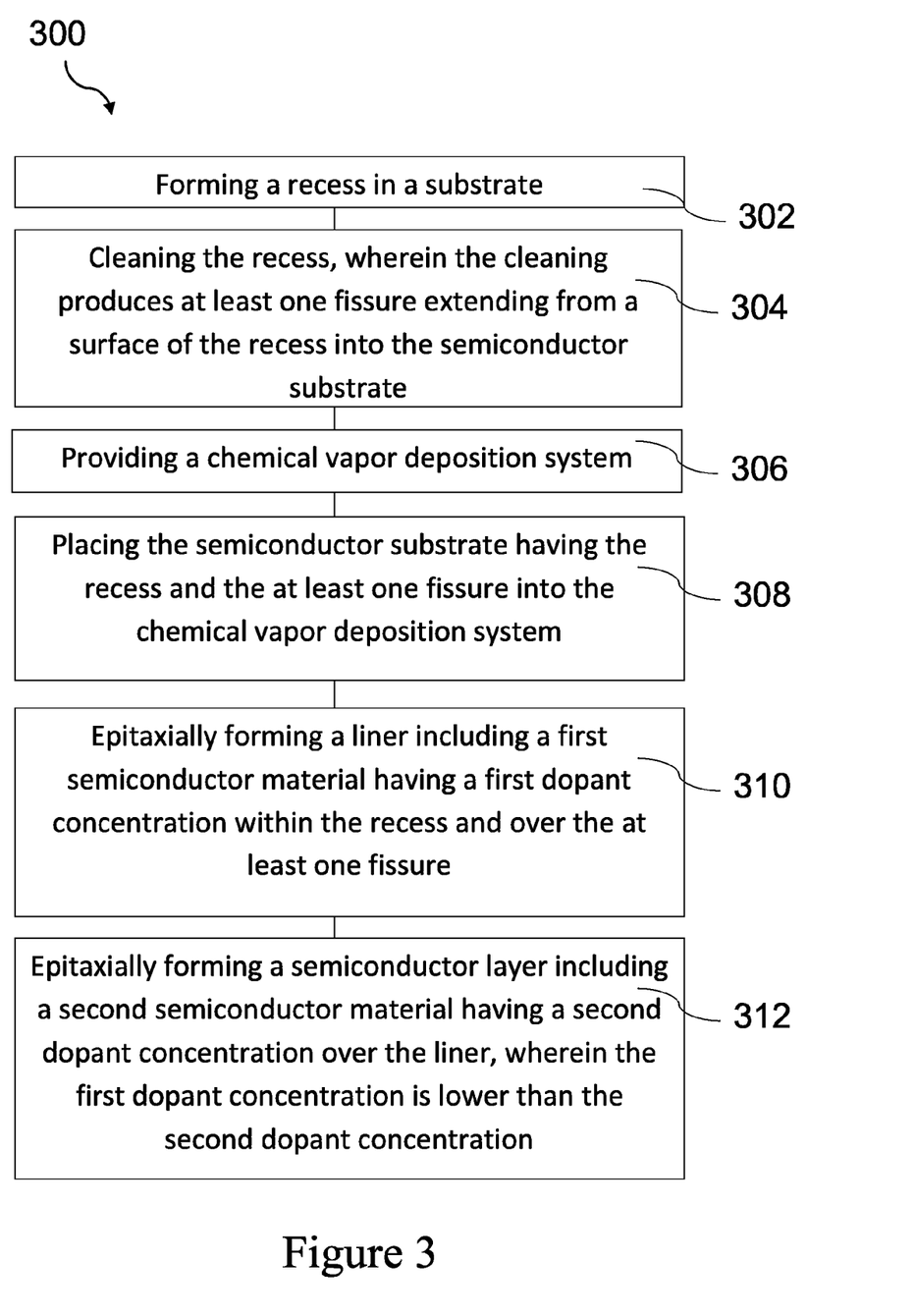
FIG. 3 shows a method of epitaxially forming a semiconductor layer in a recess, in accordance with some embodiments.

FIG. 3 shows a method 300 of epitaxially forming a semiconductor layer in a recess, in accordance with one or more embodiments.

The method 300 may include forming a recess in a substrate (in 302); cleaning the recess, wherein the cleaning produces at least one fissure extending from a surface of the recess into the semiconductor substrate (in 304); providing a chemical vapor deposition system (in 306); placing the semiconductor substrate having the recess and the at least one fissure into the chemical vapor deposition system (in 308); epitaxially forming a liner including a first semiconductor material having a first dopant concentration within the recess and over the at least one fissure (in 310); and epitaxially forming a semiconductor layer including a second semiconductor material having a second dopant concentration over the liner, wherein the first dopant concentration is lower than the second dopant concentration (in 312).

FIG. 4A to FIG. 4E show a process flow illustrating the method 300, in accordance with one or more embodiments.

Reference signs in FIG. 4A to FIG. 4E that are the same as in FIG. 2A to FIG. 2E denote the same or similar elements as in FIG. 2A to FIG. 2E. Thus, those elements will not be described in detail again here; reference is made to the description above.

Figure 4A:
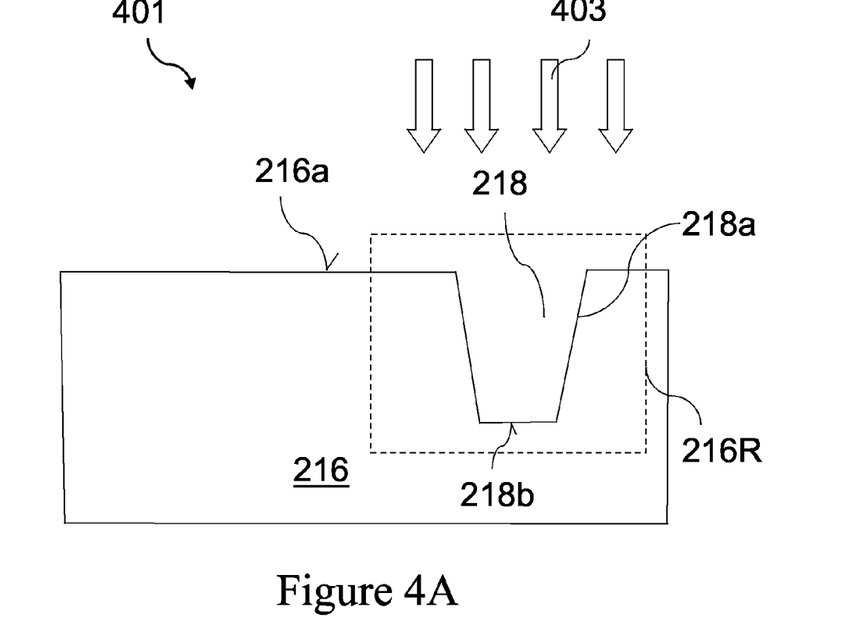
FIG. 4A to FIG. 4E show a process flow illustrating a method of epitaxially forming a semiconductor layer in a recess, in accordance with some embodiments.

As shown in FIG. 4A in a view 401, the method 300 of epitaxially forming a semiconductor layer in a recess may include forming a recess 218 in a semiconductor substrate 216.

As described above in respect of FIG. 2B, the recess 218 may be formed by means of an etching process. The etching process is shown in FIG. 4A as arrows 403. The etching process may include, or may be, at least one of a wet etch process and a dry etch process (e.g. a plasma etch process), or other suitable etching processes. As described above, a patterned mask may be used during the etching process 403.

As described above in respect of FIG. 2B, the etching process 403 for forming the recess 218 may introduce metal residue on a top surface 216a of the semiconductor substrate 216 and a surface of the recess 218, e.g. the at least one sidewall 218a and/or bottom surface 218b of the recess 218.

Figure 4B:
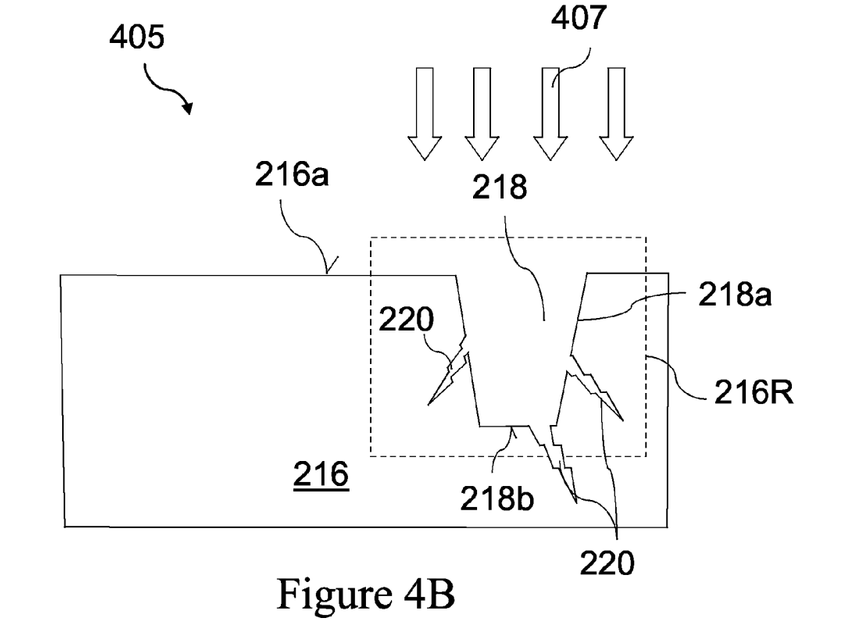

As shown in FIG. 4B in a view 405, the method 300 of epitaxially forming a semiconductor layer in a recess may include cleaning the recess 218.

The cleaning process is shown in FIG. 4B as arrows 407. As described above in respect of FIG. 2B, the cleaning process 407 may include, or may be, a wet clean process. The cleaning process 407 may include use of an etchant such as, for example, at least one of dilute hydrofluoric acid (DHF), potassium hydroxide (KOH), tetra-methyl ammonium hydroxide (TMAH or $(CH_3)_3NOH$), although other etchants may be possible as well. The cleaning process 407 may further include use of an oxidizing agent, e.g. hydrogen peroxide ($H_2O_2$), water ($H_2O$), oxygen ($O_2$), or a compound that includes oxygen.

As described above in respect of FIG. 2B, MACE of the semiconductor substrate 216 may occur during the cleaning process 407 (e.g. due to the presence of metal residue on the top surface 216a of the semiconductor substrate 216 and the surfaces of the recess 218). Accordingly, the cleaning process 407 produces at least one fissure 220 extending from a surface of the recess 218 into the semiconductor substrate 216.

Figure 4C:
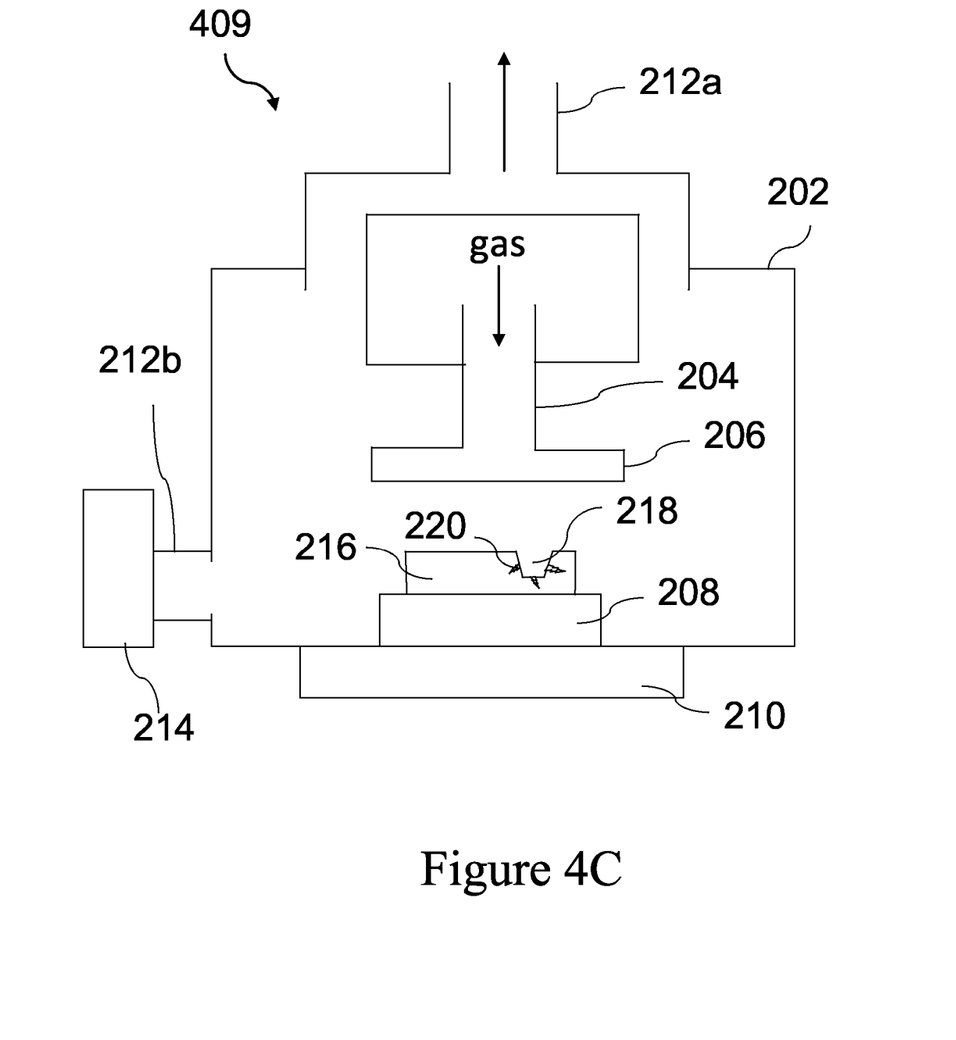

As shown in FIG. 4C in a view 409, the method 300 of epitaxially forming a semiconductor layer in a recess may include providing a chemical vapor deposition system 200, and placing the semiconductor substrate 216 having the recess 218 and the at least one fissure 220 into the chemical vapor deposition system 200. Accordingly, the above-described forming of the recess 218 and cleaning of the recess 218 may be performed external to the chemical vapor deposition system 200.

Figure 4D:
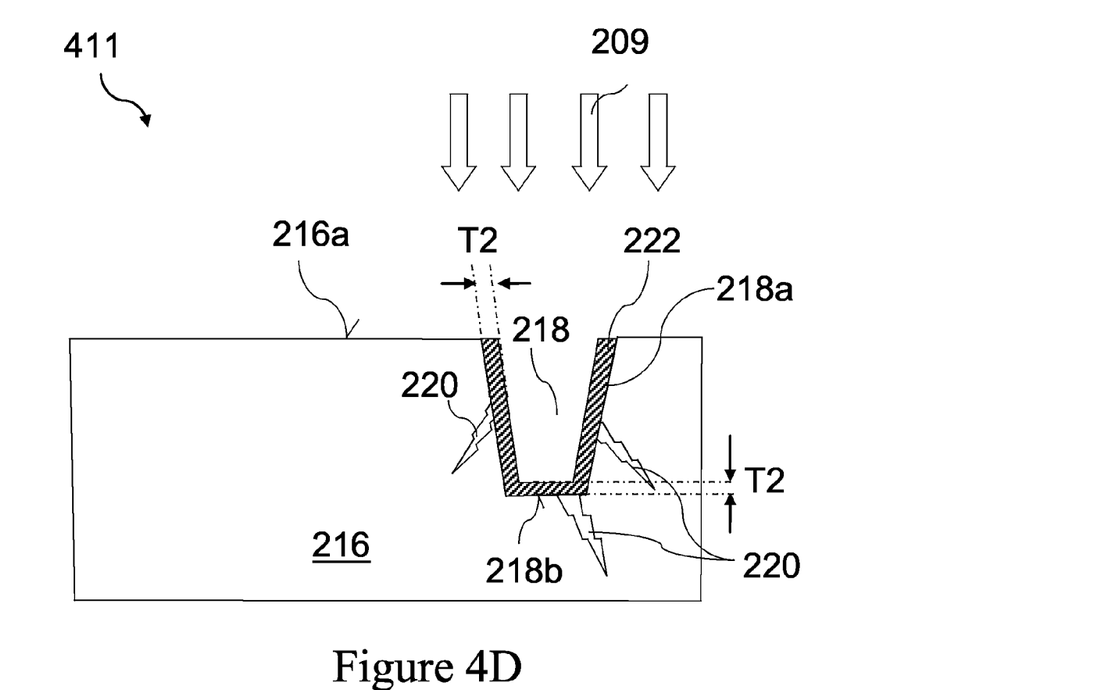

FIG. 4D shows a zoomed-in view 411 of the semiconductor substrate 216 in the chemical vapor deposition system 200. As shown in FIG. 4D, the method 300 of epitaxially forming a semiconductor layer in a recess may include epitaxially forming a liner 222 (e.g. by means of epitaxial process 209) including a first semiconductor material having a first dopant concentration within the recess 218 and over the at least one fissure 220. Examples of the first semiconductor material and the first dopant concentration are described above in relation to FIG. 2D.

Figure 4E:
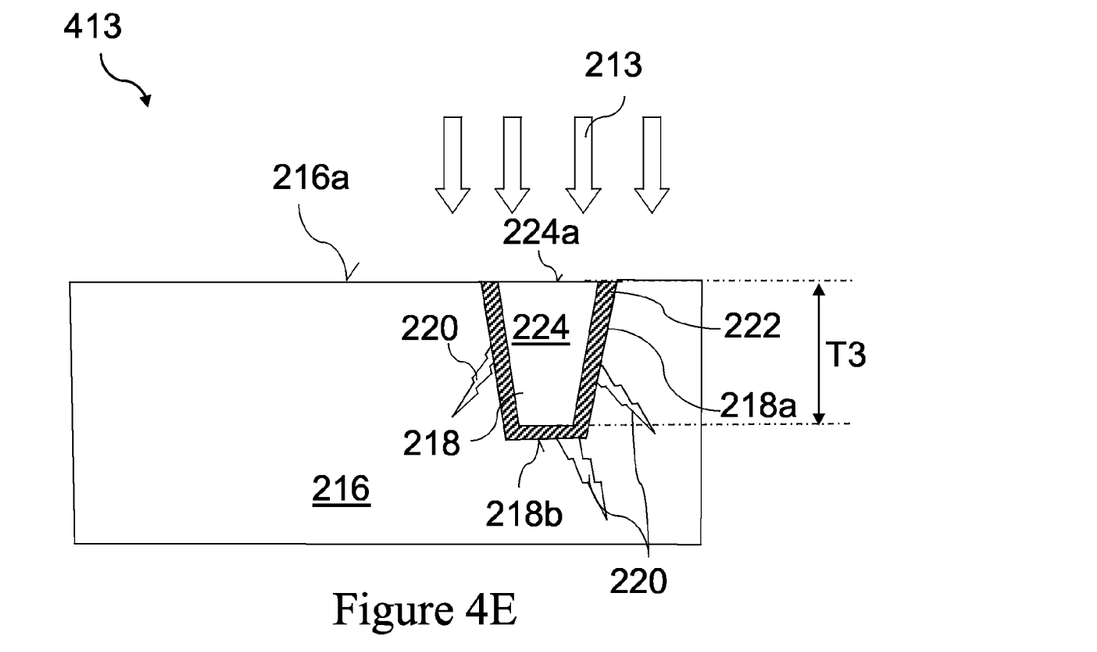

As shown in FIG. 4E in a view 413, the method 300 of epitaxially forming a semiconductor layer in a recess may include epitaxially forming a semiconductor layer (e.g. by means of epitaxial process 213) including a second semiconductor material having a second dopant concentration over the liner 222. Examples of the second semiconductor material and the second dopant concentration are described above in relation to FIG. 2E, which also described that the first dopant concentration is lower than the second dopant concentration.

Figure 5:
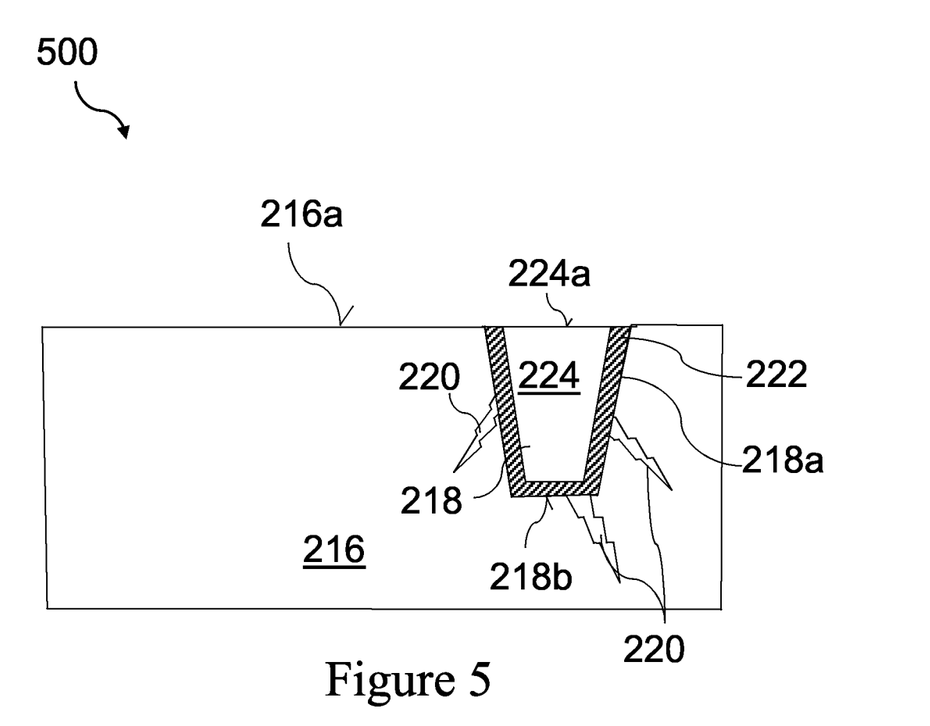
FIG. 5 shows a semiconductor device, in accordance with some embodiments.

FIG. 5 shows a semiconductor device 500 in accordance with one or more embodiments.

Reference signs in FIG. 5 that are the same as in FIG. 2A to FIG. 2E denote the same or similar elements as in FIG. 2A to FIG. 2E. Thus, those elements will not be described in detail again here; reference is made to the description above.

The semiconductor device 500 may include a semiconductor substrate 216 having a recess 218 and at least one fissure 220 extending from a surface 218a, 218b of the recess 218 into the semiconductor substrate 216.

The semiconductor device 500 may include a liner 222 including a first semiconductor material within the recess 218 and over the at least one fissure 220.

In an embodiment, an effect of forming the liner 222 over the at least one fissure 220 may be provision of a barrier over the at least one fissure 220. The liner 222, functioning as a barrier, may prevent or reduce accumulation of material in the at least one fissure 220 and/or etching of the semiconductor substrate 216 through the at least one fissure 220 during further processing of the semiconductor substrate 216. Consequently, damage in the region 216R (e.g. active region or active area) of the semiconductor substrate 216 may be reduced or avoided. Accordingly, manufacturing yield and semiconductor device reliability may be improved.

The first semiconductor material of the liner 222 may have a dopant concentration, as described above in relation to FIG. 2D. An effect of having the above-identified dopant concentrations may be that dopant atoms of the doped semiconductor material of the liner 222 are held or locked in place within the lattice of the liner 222. Accordingly, diffusion of the dopant atoms of the doped semiconductor material of the liner 222 into the at least one fissure 220 during further processing of the semiconductor substrate 216 may be reduced or avoided. Consequently, accumulation of material in the at least one fissure 220 is reduced or avoided, and damage in the region 216R (e.g. active region or active area) of the semiconductor substrate 216 may be reduced or avoided. Accordingly, manufacturing yield and semiconductor device reliability may be improved.

As described above, the liner 222 may be grown at a temperature falling in a higher range of at least one of the above-identified temperature ranges of the epitaxial process 209. In an embodiment, an effect of growing the liner 222 at such a temperature may be promotion of solid phase epitaxial regrowth (SPER) in the at least one fissure 220. Accordingly, the deleterious effects of MACE on the semiconductor substrate 216 may be reduced or eliminated. Consequently, damage in the region 216R (e.g. active region or active area) of the semiconductor substrate 216 may be reduced or avoided. Accordingly, manufacturing yield and semiconductor device reliability may be improved.

As described above, the partial pressure of an etchant gas provided during the epitaxial process 209 may be less than about 10 Torrs, for example in a range from about 0.01 Torrs to about 10 Torrs, for example in a range from about 0.1 Torrs to about 6 Torrs, for example in a range from about 1 Torr to about 5 Torrs, although other partial pressures may be possible as well in accordance with other embodiments. An effect of the partial pressure of the etchant gas provided during the epitaxial process 209 being in at least one of the above-identified pressure ranges may be prevention or reduction of etching the semiconductor substrate 216 through the at least one fissure 220. Consequently, damage in the region 216R (e.g. active region or active area) of the semiconductor substrate 216 may be reduced or avoided. Accordingly, manufacturing yield and semiconductor device reliability may be improved.

The semiconductor device 500 may include a semiconductor layer 224 including a second semiconductor material disposed over the liner 222.

According to various embodiments presented herein, a method of epitaxially forming a semiconductor layer in a recess is provided. The method may include providing a chemical vapor deposition system; placing a semiconductor substrate having a recess into the chemical vapor deposition system, wherein the semiconductor substrate includes at least one fissure extending from a surface of the recess into the semiconductor substrate; epitaxially forming a liner including a first semiconductor material within the recess and over the at least one fissure; and epitaxially forming a semiconductor layer including a second semiconductor material over the liner.

According to various embodiments presented herein, a method of epitaxially forming a semiconductor layer in a recess is provided. The method may include forming a recess in a substrate; cleaning the recess, wherein the cleaning produces at least one fissure extending from a surface of the recess into the semiconductor substrate; providing a chemical vapor deposition system; placing the semiconductor substrate having the recess and the at least one fissure into the chemical vapor deposition system; epitaxially forming a liner including a first semiconductor material having a first dopant concentration within the recess and over the at least one fissure; and epitaxially forming a semiconductor layer including a second semiconductor material having a second dopant concentration over the liner, wherein the first dopant concentration is lower than the second dopant concentration.

According to various embodiments presented herein, a semiconductor device is provided. The semiconductor device may include a semiconductor substrate having a recess and at least one fissure extending from a surface of the recess into the semiconductor substrate; a liner including a first semiconductor material within the recess and over the at least one fissure; and a semiconductor layer including a second semiconductor material disposed over the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
etching a recess in a semiconductor substrate, the etching producing a metal residue over a surface of the recess;

exposing the recess to a cleaning process, the cleaning process causing the metal residue to etch at least one fissure in the semiconductor substrate, the at least one fissure extending from the surface of the recess into the semiconductor substrate;

epitaxially forming a liner comprising a first semiconductor material having a first dopant concentration within the recess and over the at least one fissure; and epitaxially forming a semiconductor layer comprising a second semiconductor material having a second dopant concentration over the liner.

2. The method of claim 1, wherein the first dopant concentration is lower than the second dopant concentration.

3. The method of claim 1, wherein the metal residue comprises at least one of iron, chromium, gold, platinum, silver, or aluminum.

4. The method of claim 1, wherein the first semiconductor material has a conductivity type different from a conductivity type of the semiconductor substrate.

5. The method of claim 1, wherein epitaxially forming the liner comprises using a first epitaxial process performed at a temperature in a range from about 550 degrees Celsius to about 800 degrees Celsius.

6. The method of claim 1, wherein epitaxially forming the semiconductor layer comprises using a second epitaxial process performed at a temperature in a range from about 550 degrees Celsius to about 750 degrees Celsius.

7. The method of claim 1, wherein the cleaning process comprises exposing the recess to an etchant.

8. The method of claim 7, wherein the etchant comprises at least one of dilute hydrofluoric acid, potassium hydroxide, or tetra-methyl ammonium hydroxide.

9. The method of claim 1, wherein the cleaning process comprises exposing the recess to an oxidizing agent.

10. The method of claim 9, wherein the oxidizing agent comprises at least one of hydrogen peroxide, water, or oxygen.

11. A method, comprising:

lining a recess with a first semiconductor material, the first semiconductor material covering at least one fissure extending from a surface of the recess into a semiconductor substrate; and filling the recess with a second semiconductor material, the second semiconductor material disposed over the first semiconductor material, wherein a dopant concentration of the second semiconductor material is greater than a dopant concentration of the first semiconductor material.

12. The method of claim 11, wherein the dopant concentration of the second semiconductor material is greater than about $4 \times 10^{20}$ atoms per cubic centimeter.

13. The method of claim 11, wherein lining the recess with the first semiconductor material comprises a selective epitaxial growth process, wherein a selectivity of the selective epitaxial growth process is controlled by a partial pressure of an etchant gas used in the selective epitaxial growth process.

14. The method of claim 11, wherein filling the recess with the second semiconductor material comprises at least one of a cyclic deposition etch process or a selective epitaxial growth process.

15. A semiconductor device, comprising:

a recess extending into a semiconductor substrate, the recess having at least one fissure extending from a surface of the recess into the semiconductor substrate;

a liner disposed within the recess, the liner comprising a doped first semiconductor material and conforming to a shape of the recess; and a semiconductor layer comprising a doped second semiconductor material disposed within the recess and over the liner.

16. The semiconductor device of claim 15, wherein the doped first semiconductor material has a graded doping profile.

17. The semiconductor device of claim 15, wherein a thickness of the doped first semiconductor material is in a range from about 1 nanometer to about 5 nanometers.

18. The semiconductor device of claim 15, wherein a thickness of the doped second semiconductor material is in a range from about 15 nanometers to about 60 nanometers.

19. The semiconductor device of claim 15, wherein a concentration of dopant atoms in the doped second semiconductor material is greater than about $4 \times 10^{20}$ atoms per cubic centimeter.

20. The semiconductor device of claim 15, wherein a concentration of dopant atoms in the doped first semiconductor material is less than about $4 \times 10^{20}$ atoms per cubic centimeter.

* * * * *